US012669446B2

(12) United States Patent
Capelli

(10) Patent No.: US 12,669,446 B2
(45) Date of Patent: Jun. 30, 2026

(54) SYSTEM AND METHOD FOR INSPECTING A MASK FOR EUV LITHOGRAPHY

(71) Applicant: Carl Zeiss SMT GmbH, Oberkochen (DE)

(72) Inventor: Renzo Capelli, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 738 days.

(21) Appl. No.: 17/950,196

(22) Filed: Sep. 22, 2022

(65) Prior Publication Data

US 2023/0020107 A1      Jan. 19, 2023

Related U.S. Application Data

(63) Continuation of application No. PCT/EP2021/057512, filed on Mar. 24, 2021.

(30) Foreign Application Priority Data

Apr. 7, 2020    (DE) .......................... 102020204508.9

(51) Int. Cl.

| | |
|---|---|
| *G03F 1/22* | (2012.01) |
| *G01N 21/88* | (2006.01) |
| *G01N 21/956* | (2006.01) |
| *G03F 1/84* | (2012.01) |

(52) U.S. Cl.
CPC ....... *G01N 21/956* (2013.01); *G01N 21/8806* (2013.01); *G01N 2021/95676* (2013.01); *G03F 1/84* (2013.01)

(58) Field of Classification Search
CPC ............. G01N 21/956; G01N 21/8806; G01N 2021/95676; G03F 1/84
See application file for complete search history.

(56) References Cited

U.S. PATENT DOCUMENTS

| | | | |
|---|---|---|---|
| 8,103,086 B2 | 1/2012 | Shi et al. | |
| 2006/0199287 A1* | 9/2006 | Fu ....................... | G01N 21/9501 |
| | | | 438/16 |
| 2006/0291714 A1 | 12/2006 | Wu et al. | |
| 2009/0228228 A1* | 9/2009 | Badger ................ | G01N 21/956 |
| | | | 702/83 |
| 2011/0249247 A1 | 10/2011 | Cramer et al. | |
| 2013/0028505 A1 | 1/2013 | Dmitriev et al. | |
| 2013/0063716 A1 | 3/2013 | Mann et al. | |
| 2013/0336575 A1* | 12/2013 | Dalla-Torre ............ | G06T 7/001 |
| | | | 382/149 |

(Continued)

FOREIGN PATENT DOCUMENTS

| | | | | |
|---|---|---|---|---|
| CN | 110501880 | 11/2019 | ............... | G03F 7/20 |
| DE | 102010029049 | 11/2011 | ............. | G02B 17/00 |

(Continued)

OTHER PUBLICATIONS

The Office Action issued by the Chinese Patent Office for Application No. CN 202180025602.0, dated Dec. 31, 2024 (with English Translation).

(Continued)

*Primary Examiner* — Iriana Cruz
(74) *Attorney, Agent, or Firm* — Fish & Richardson P.C.

(57) ABSTRACT

A pre-classification of potential mask defects on the basis of machine learning is provided during the inspection of a mask for EUV lithography.

23 Claims, 1 Drawing Sheet

(56) References Cited

U.S. PATENT DOCUMENTS

| | | | | |
|---|---|---|---|---|
| 2014/0341462 A1* | 11/2014 | Sezginer | ............... | G03F 7/7065 |
| | | | | 382/149 |
| 2014/0354983 A1 | 12/2014 | Kolchin et al. | | |
| 2015/0128098 A1* | 5/2015 | Chang | ................... | G03F 7/7065 |
| | | | | 716/52 |
| 2017/0176851 A1 | 6/2017 | Peters et al. | | |
| 2017/0235031 A1 | 8/2017 | Takehisa et al. | | |
| 2019/0073568 A1* | 3/2019 | He | ........................... | G06T 7/001 |
| 2019/0079381 A1 | 3/2019 | Hellweg et al. | | |
| 2019/0331608 A1* | 10/2019 | Terasawa | .................. | G03F 1/84 |
| 2019/0354019 A1* | 11/2019 | Freytag | .................. | G01Q 30/02 |
| 2020/0096862 A1* | 3/2020 | Tolani | ....................... | G03F 1/22 |
| 2021/0158215 A1 | 5/2021 | Seidel et al. | | |

FOREIGN PATENT DOCUMENTS

| | | | | |
|---|---|---|---|---|
| DE | 102014217907 | 3/2016 | ............... | G03F 1/72 |
| DE | 102018211099 | 1/2020 | ............. | G06F 17/18 |
| JP | 2019-049715 | 3/2019 | ............... | G03F 1/84 |
| KR | 1020130028990 | 3/2013 | ........... | H01L 21/027 |
| KR | 1020190029469 | 3/2019 | ............... | G03F 7/20 |
| TW | 201033754 | 9/2010 | ............... | G03F 7/20 |
| TW | 201903392 | 1/2019 | ............. | G01N 21/88 |
| WO | WO 2019/216303 | 11/2019 | ........... | G01N 21/956 |

OTHER PUBLICATIONS

The Office Action issued by the German Patent Office for Application No. DE 10 2020 204 508.9, dated Feb. 22, 2021 (with English Translation).

The Office Action and Search Report issued by the Taiwan Patent Office for Application No. TW 110112370, dated Jan. 4, 2022 (with English Translation).

Huang et al., "Process Window Impact of Progressive Mask Defects, its Inspection and Disposition Techniques (go / no-go criteria) via a Lithographic Detector", *Proceedings of SPIE*, vol. 5992, pp. 599206-1-599206-8 (2005).

The Notice of Allowance issued by the Korean Patent Office for Application No. KR 10-2022-7034390, dated Aug. 29, 2025 (with English Translation).

The Office Action issued by the Chinese Patent Office for Application No. CN 202180025602.0, Dated Aug. 4, 2025 (with English Translation).

* cited by examiner

SYSTEM AND METHOD FOR INSPECTING A MASK FOR EUV LITHOGRAPHY

CROSS-REFERENCE TO RELATED APPLICATIONS

This application is a continuation of and claims priority under 35 U.S.C. § 120 from PCT Application No. PCT/EP2021/057512, filed on Mar. 24, 2021, which claims priority from German Application No. 10 2020 204 508.9, filed on Apr. 7, 2020. The entire contents of each of these priority applications are incorporated herein by reference.

TECHNICAL FIELD

The invention relates to a system for inspecting a mask for EUV lithography. The invention moreover relates to a method for inspecting a mask for EUV lithography.

BACKGROUND

Lithography methods, for example, are used to produce micro-structured or nano-structured components, for example memory chips. In this context, structures are imaged from a mask onto a wafer with the aid of a projection exposure apparatus. To ensure that the masks are suitable for the envisaged purpose, they are tested with the aid of an inspection system, in particular an APMI (actinic patterned mask inspection) system, prior to their use. In particular, provision can also be made of an inspection of the substrate provided to produce a mask, which is also referred to as mask blank. To this end, use can be made of an ABI (actinic blank inspection) system.

By way of example, an ABI system is known from US 2017/0235031 A1.

There is always the need to improve a system and a method for inspecting a mask for EUV lithography.

These aspects are achieved by use of the features of the independent claims.

SUMMARY

A core of the invention includes utilizing a multi-stage method or a system with a plurality of partial systems for the purposes of inspecting a lithography mask. In this context, potential mask defects are initially identified and/or localized with the aid of a first partial system. Then, the potential mask defects are pre-classified, in particular assessed using a confidence parameter, with the aid of a second partial system. Then, a subset of the potential mask defects is checked on the basis of the pre-classification, in particular on the basis of the confidence parameter, of the same.

According to the invention, it was recognized to be advantageous to sort out from the potential mask defects ascertained in the first partial step those which allow a decision to be made with a given reliability that these are in fact mask defects, without requiring further checks. It may likewise be advantageous to sort out those potential mask defects (so-called false positives) which allow a decision to be made with a given reliability that these are not defects or are defects that are not relevant to the further use of the mask, without requiring further checks.

In the checking step carried out by the third partial system, it is then only necessary to check a subset of the potential mask defects ascertained in the first method step. This leads to a considerable time saving.

The system and the method are equally suited to inspecting a mask and to inspecting a mask blank. Below, the term mask is understood to mean both actually structured masks and unstructured masks, i.e. mask blanks.

EUV radiation is understood to mean electromagnetic radiation at a wavelength ranging from 5 nm to 30 nm. In particular, this can relate to radiation at a wavelength of 13.5 nm or 7 nm.

According to one aspect of the invention, the second partial system for pre-classification of the potential mask defects utilizes an automated image analysis method, in particular an automated pattern recognition method. In particular, this can be a fully automatic method. In particular, this can be a non-algorithmic method.

The second partial system can also include algorithmic pre- or post-treatment steps, in particular filtering steps and/or transformation steps, for example one or more Fourier transforms. In particular, the pre-classification can be carried out on the basis of data in the spatial domain or in the frequency domain.

According to a further aspect of the invention, the second partial system for pre-classification of the potential mask defects utilizes machine learning. In particular, the pre-classification can be carried out in software-based fashion.

In particular, the second partial system can comprise a data processing device. In particular, the data processing device serves to process the data provided by the first partial system to identify and/or localize potential mask defects.

The second partial system can be data-connected to the first partial system. It can also be embodied as a constituent part of the first partial system. It can also be embodied as a constituent part of the third partial system, as a constituent part of a common control device for the partial systems or as a separate partial system.

The second partial system can comprise a separate optical system. In particular, it can comprise an optical system for imaging the mask. In particular, this can be an actinic system.

In this context, an actinic system is understood to be a system which, for imaging and/or testing, uses illumination radiation at a wavelength corresponding to the wavelength that is provided for the subsequent use of the mask in a projection exposure apparatus for structuring a wafer.

In particular, the second partial system can comprise an EUV system.

According to a further aspect of the invention, the second partial system and the third partial system can use the same optical system for checking the mask. In particular, the second partial system and the third partial system can comprise a common optical system. This reduces the structural outlay for the overall system.

In particular, the second partial system and the third partial system can be formed by a common optical system, in particular an identical optical system, which is used with different measurement modes.

The second partial system and the third partial system can also each comprise independent optical systems. This allows the second and third inspection steps to be carried out in parallel. This can increase the overall throughput of the system.

According to a further aspect of the invention, the second partial system has a memory for storing a database with pre-classified mask defects. In particular, the second partial system can have a memory with a database with pre-classified mask defects. The database can also be interchangeable. In particular, the database can be updated and/or upgradable.

In particular, it is possible to compare the potential mask defects identified and/or localized by the first partial system with pre-classified mask defects from the database. It was found that this facilitates a fast yet reliable classification of mask defects.

In particular, the database can be upgradable. This improves the predictability of the classification of the mask defects.

The database can also be interchangeable. This renders it possible to keep available specific databases for different mask types, for example for masks with different structure elements. This can further improve the reliability of the pre-classification.

According to a further aspect of the invention, the second partial system is embodied in such a way that it divides the potential mask defects into at least two classes, in particular into two, three or more classes.

In this context, one class contains the mask defects not requiring further checks. A class separate therefrom contains the mask defects that should be checked by the third partial system.

In particular, the defects reliably identified incorrectly (so-called false positives) and the defects reliably identified correctly are classified as the first class with the mask defects not requiring further checks.

The remaining defects, which do not allow a statement with sufficient reliability to be made, are classified as the further class.

The classification of the potential defects in relation to the different classes can be determined on the basis of one or more parameters. These can be continuous or discrete parameters.

It was found that it is usually possible to significantly reduce the number of mask defects to be checked in the third inspection step by way of the pre-classification carried out with the aid of the second partial system.

The ratio of the number of mask defects to be checked with the aid of the third partial system or in the third inspection step to the overall number of mask defects identified and/or localized by use of the first partial system or in the first inspection step is in particular no more than 20%, in particular no more than 10%, in particular no more than 5%, in particular no more than 3%, in particular no more than 2%, in particular no more than 1%.

According to a further aspect of the invention, the classification speed $v_2$ of the second partial system is greater than the checking speed $v_3$ of the third partial system, $v_2 > v_3$.

The classification speed $v_2$ of the second partial system is in particular at least 500 classified defects per hour, in particular at least 750 classified defects per hour, in particular at least 1000 classified defects per hour, in particular at least 1250 classified defects per hour, in particular at least 1500 classified defects per hour, in particular at least 2000 classified defects per hour.

In particular, the following applies: $v_2/v_3 > 1.1$, in particular $v_2/v_3 > 1.2$, in particular $v_2/v_3 > 1.5$, in particular $v_2/v_3 > 2$, in particular $v_2/v_3 > 2$, in particular $v_2/v_3 > 3$, in particular $v_2/v_3 > 5$, in particular $v_2/v_3 > 10$. In particular, the following applies: $v_2/v_3 > 1/(1-a)$, where a specifies the expected ratio of the number of potential mask defects to be checked by the third partial system to the number of potential mask defects to be classified by the second partial system. The number of potential mask defects to be classified by the second partial system in this context just equals the number of potential mask defects identified and/or localized by the first partial system. The ratio a can be determined experimentally on the basis of masks to be checked.

According to a further aspect of the invention, the first partial system for inspection of the mask uses illumination radiation at a wavelength of longer than 30 nm, in particular longer than 100 nm. In particular, the first partial system can comprise a non-actinic optical system. In particular, it can comprise a DUV system. In this respect, exemplary reference is made to U.S. Pat. No. 8,103,086 B2.

In particular, the first partial system uses illumination radiation at a wavelength of 193 nm or longer for the inspection of the mask.

According to a further aspect of the invention, the second partial system for pre-classification of the potential mask defects and/or the third partial system for checking a subset of the potential mask defects comprises an optical system with illumination radiation at a wavelength in the EUV range.

In particular, the second partial system and/or the third partial system can comprise an actinic optical system.

In particular, the second partial system and/or the third partial system can comprise an actinic aerial image system, i.e. an optical system with illumination radiation at a wavelength in the EUV range for producing an aerial image of the mask. In particular, this can be a scanning system. In respect of an actinic aerial image system, exemplary reference is made to DE 10 2010 029 049 A1.

According to a further aspect of the invention, the system comprises a memory unit which is data-connected to the first partial system. In particular, the memory unit serves to store a data record with data relating to potential mask defects.

In particular, the memory unit can be data-connected or able to be data-connected to the second partial system.

The data in relation to potential mask defects ascertained by the first partial system can be stored, in particular, on a physical storage medium or in a virtual memory. In this context, a virtual memory can simplify the data transmission from the first partial system to the second partial system.

The data of the pre-classification of the potential mask defects ascertained by the second partial system can be stored on a physical storage medium or in a virtual memory. In this context, storage in a virtual memory simplifies the data transmission from the second partial system to the third partial system.

According to a further aspect of the invention, the second inspection step comprises an automated image analysis method for pre-classifying the potential mask defects.

The image analysis method can comprise pre-processing steps, for example filter steps or transformation steps, in particular one or more Fourier transforms.

The image analysis can be carried out in the spatial domain or in the frequency domain.

According to one aspect of the invention, the second inspection step for pre-classifying the potential mask defects comprises a method based on machine learning. In particular, this can be a method based on supervised learning. This can also relate to reinforcement learning. In this context, the results from the third inspection step can be utilized for further training of the second inspection step. In this context, different types of masks, in particular, can be treated separately. This can lead to an improvement in the reliability of the pre-classification.

According to a further aspect of the invention, a distribution of one-dimensional and/or two-dimensional structures in the image of the mask recorded in the first inspection step is analyzed for the purposes of pre-classifying the potential mask defects.

These structures can be analyzed either in the spatial domain or in the frequency domain.

In particular, the one-dimensional structures can be critical dimensions (CDs). In particular, the two-dimensional structures can be contours of the images of the mask recorded in the first inspection step or a Fourier transform of the same. It is also possible to analyze properties of these structures, for example the diameter thereof.

According to a further aspect of the invention, an intensity distribution of an image of the mask recorded in the first inspection step is analyzed for the purposes of pre-classifying the potential mask defects. In particular, the image of the mask can be analyzed pixel-by-pixel. Upsampling or down-sampling is possible.

One or more of the partial systems 2, 3, 4 can be imaging systems, which each record an overall image of the mask or of the mask blank in one exposure, or scanning systems, in which the images of the mask or of the mask blank are assembled from a plurality of exposures.

According to a further aspect of the invention, the second inspection step comprises one or more pre-processing steps, in particular one or more correction steps for correcting one or more images recorded in the first inspection step in respect of photon noise.

According to a further aspect of the invention, the second inspection step comprises a comparison step for comparing one or more images of the mask recorded in the first inspection step with data from a database.

According to a further aspect of the invention, the third inspection step comprises an actinic method, in particular a method for ascertaining and/or analyzing an aerial image, in particular using illumination radiation in the EUV range.

According to a further aspect of the invention, the first inspection step comprises a non-actinic method. In particular, the first inspection step can comprise a method for ascertaining an image of the mask using illumination radiation in the DUV wavelength range, in particular using illumination radiation at a wavelength of 193 nm.

In particular, the method according to the invention can comprise at least two optical inspection steps, in which images of the mask are ascertained and/or analyzed using illumination radiation at different wavelengths. It was found that this firstly reduces the time required to inspect the mask and secondly can improve the reliability of the characterization of the mask defects.

BRIEF DESCRIPTION OF DRAWINGS

Further advantages, details and particulars of the invention are evident from the description of exemplary embodiments with reference to the figures. In detail.

DETAILED DESCRIPTION

Figure 2:
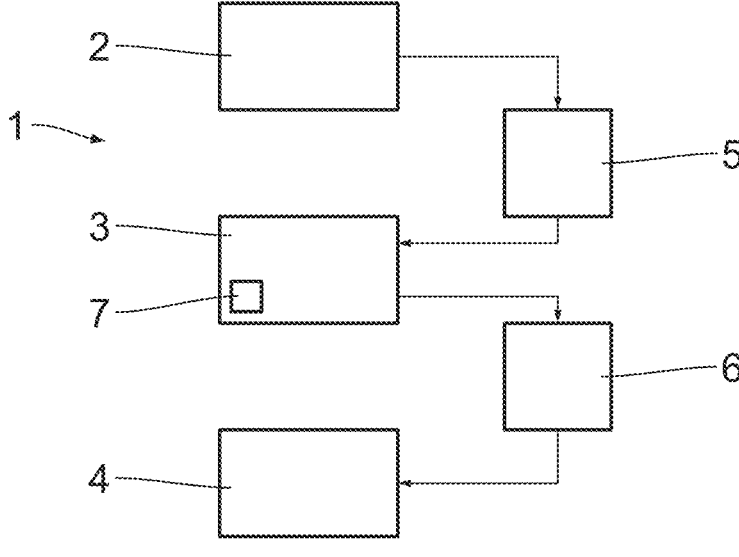

FIG. 2 schematically illustrates a system 1 for inspecting a mask for EUV lithography. The illustration should be understood to be exemplary.

The system 1 comprises a first partial system 2, a second partial system 3 and a third partial system 4.

Preferably, so-called multilayer defects of the mask, in particular of the mask blank, are ascertained separately with the aid of a separate system, in particular an actinic blank inspection tool (ABI tool).

The first partial system 2 serves for optical inspection of the mask. In particular, it serves to identify and/or localize potential mask defects.

The first partial system 2 comprises, in particular, an inspection system for inspecting the mask using illumination radiation in the DUV range, in particular using illumination radiation at a wavelength of 193 nm. For details of such a system, reference should be made in exemplary and representative fashion to U.S. Pat. No. 8,103,086 B2, which is hereby incorporated in the present application as part thereof.

The second partial system 3 serves, in particular, to pre-classify the potential mask defects identified and/or localized by use of the first partial system 2.

The second partial system 3 can comprise an optical system with a wavelength in the EUV range.

In particular, the third partial system 4 serves to check the potential mask defects.

The third partial system 4 comprises, in particular, an optical system for checking the mask using a wavelength in the EUV range. For details of such a system, reference should be made in exemplary and representative fashion to DE 10 2010 029 049 A1, which is hereby fully incorporated in the present application as part thereof.

As is illustrated schematically in FIG. 2, the first partial system 2 is data-connected to a first memory unit 5. The first memory unit 5, in turn, is data-connected to the second partial system 3.

The first memory unit 5 can be embodied as a separate memory unit, in particular as a separate storage medium, or as a virtual memory. It can also be embodied as a constituent part of the first partial system 2 or as a constituent part of the second partial system 3.

The first memory unit 5 serves to store the data ascertained by the first partial system 2 to identify and/or localize potential mask defects. The corresponding data serve as input for the further inspection of the mask with the aid of the second partial system 3.

The second partial system 3 is data-connected to a second memory unit 6.

The second memory unit 6 can be embodied as a separate memory unit, in particular as a separate storage medium, or as a virtual memory. It can also be embodied as a constituent part of the second partial system 3 or as a constituent part of the third partial system 4.

The second partial system 3 can comprise an optical system for examining the mask, in particular for generating and analyzing an aerial image of the mask. In particular, this can be an EUV system.

The third partial system 4 comprises an optical system for checking and analyzing potential mask defects. In particular, the optical system of the third partial system 4 is an actinic system.

The second partial system 3 comprises a memory 7 for storing a database with pre-classified mask defects. The memory 7 can be embodied separately from the second partial system 3.

Figure 1:
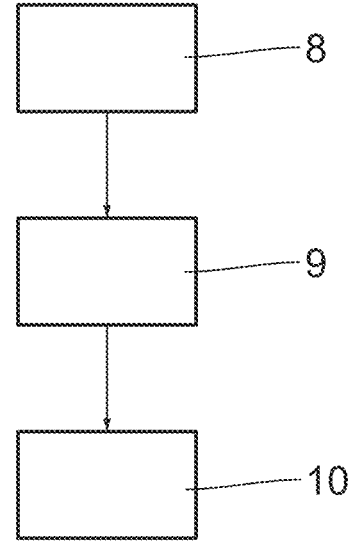
FIG. 1 schematically shows a course of a method for inspecting a mask for EUV lithography and FIG. 2 schematically shows constituent parts of a system for inspecting a mask for EUV lithography.

Below, the basic course of the method for inspecting the mask is described with reference to FIG. 1.

The method is a multi-stage method. In particular, the method comprises a first inspection step 8, a second inspection step 9 and a third inspection step 10.

The inspection steps 8, 9, 10 can in turn comprise one or more partial steps.

The first inspection step 8 serves, in particular, to record an image of the provided mask and to identify and/or localize potential mask defects in the provided mask.

The second inspection step 9 serves, in particular, to pre-classify the potential mask defects.

The third inspection step 10 serves, in particular, to check a subset of the potential mask defects.

In the first inspection step 8, a structured lithography mask, in particular, is analyzed with the aid of an optical system. In the first inspection step 8, a list of potential mask defects is created, in particular with the aid of a DUV system. The list of potential mask defects can be stored in the first memory unit 5.

In the second inspection step 9, the mask is examined using an actinic optical system, in particular an EUV system. In this context, the potential defects as per the list created in the first inspection step 8, in particular, are pre-classified.

In particular, provision is made for the potential defects ascertained in the first inspection step 8 to be divided into at least two classes, wherein the one class only contains potential defects requiring no further checks while the other class contains potential defects for which a final assessment as to whether this is in fact a defect, in particular a defect relevant to the envisaged use of the mask, cannot be made with sufficient reliability.

Classified as the first class are, in particular, potential defects that have a sufficient probability of not being actual defects (so-called false positives), in particular with a confidence of at least 95%, in particular at least 97%, in particular at least 99%. Moreover, classified as the first class are potential defects which are true defects, in particular defects relevant to the envisaged use of the mask, with a confidence of at least 95%, in particular at least 97%, in particular at least 99%.

The remaining potential defects, for which a final statement with a confidence of at least 95% is not possible, are classified as the second class.

The second inspection step 9 comprises, in particular, a fast disposition of the potential mask defects. The classification speed is at least 500 classified defects per hour, in particular at least 750 classified defects per hour, in particular at least 1000 classified defects per hour, in particular at least 1250 classified defects per hour, in particular at least 1500 classified defects per hour, in particular at least 2000 classified defects per hour.

In particular, a method based on machine learning is used to pre-classify the potential mask defects in the second inspection step 9.

Different details and aspects of the method step for pre-classifying the potential mask defects are described below.

The first partial system can have a fast disposition mode. In this mode of operation, the images in first inspection steps can be recorded particularly quickly. In this context, it is possible to dispense with the accuracy, in particular resolution, required for the mode used for the accurate, optical analysis of potential defects. Being able to delimit the images of the potential defects from photon noise with sufficient reliability may suffice.

The second inspection step 9 can comprise pattern recognition. The pattern recognition can comprise a threshold method (threshold setting) and an image contour analysis.

One-dimensional structures and/or two-dimensional and/or logical structures can be analyzed during the image contour analysis. In this context, logical structures are understood to be non-symmetrical or non-periodic structures.

In particular, provision can be made to set an automated threshold in order to measure a critical dimension (CD) for each structure element in the overall image of the mask. It was found that the analysis of the distribution of the values of the critical dimensions have clearly defined peaks in the frequency domain. Deviations from these peaks can indicate potential defects. It was found that the power spectral density (PSD) of the critical dimensions in the aerial image has a continuum and peaks, wherein the properties of the peaks can be influenced by defects.

Further, provision can be made for properties of these peaks to be analyzed, for example the full width at half maximum (FWHM) thereof. In this context, photon noise can be taken into account.

Training of the system for machine learning can be provided in the spatial domain or in the frequency domain.

Further, provision can be made for a correction method for correcting photon noise to be carried out prior to the image analysis in the second inspection step 9.

According to one variant, provision can be made for variations of the image contours or of a frequency distribution of measured structure parameters of the possibly pre-processed image, in particular noise-corrected image, to be analyzed and to be compared to data in a database of defect-free structures and defects.

In particular, the second inspection step 9 can comprise a comparison step for comparing potential defects, in particular certain parameters of potential defects, to the corresponding data in a database.

The pre-classification can be implemented on the basis of a distribution of ascertained critical dimensions or a distribution of certain parameters of contours in the spatial domain or in the frequency domain. By way of example, low-intensity peaks in the power spectral density (PSD) may indicate defects. A pre-classification on this basis is possible after appropriate preceding training.

As an alternative to a pre-classification on the basis of critical dimensions or contours, provision can also be made for the intensity distribution or the frequency of changes of this distribution to be evaluated. In particular, the evaluation can be carried out pixel-by-pixel. Upsampling or downsampling is also possible. Once again, provision can be made in this context for a correction for taking account of photon noise. The distribution analyzed in this way can be compared to data in a database which was used to train the system for a machine learning method. In this respect, it is noted that, in particular on account of the contours, defects have different frequencies to the usual mask structures, in particular different frequencies to the frequencies of regular mask structures, in particular periodic mask structures.

Further processing steps, for example smoothing methods (image smoothing) or low pass filtering steps, can be provided in all methods, in particular in order to filter out noise.

According to a further alternative, provision can be made for the images of the mask ascertained in the second inspection step 9, in particular images of the mask defects, to be compared directly to images in a database.

The database can be supplemented on an ongoing basis in all of the methods. As a result, it is possible to continually improve the pre-classification in the second inspection step 9, in particular render this more reliable. This leads as a result to the ratio of the potential mask defects to be checked in the third inspection step 10 to the number of potential mask defects ascertained overall in the first inspection step 8 decreasing on average.

It was found that, with the aid of the pre-classification in the second inspection step 9, it is possible to reduce the number of potential mask defects to be checked in the third inspection step 10 from several thousand potential mask defects ascertained in the first inspection step 8 to less than 200, in particular less than 100.

An actinic method, in particular an actinic aerial image method, is provided to check the potential mask defects in the third inspection step 10.

The overall result of the inspection method, in particular of the three inspection steps 8, 9 and 10, is a statement regarding the relevance of the mask defects for the envisaged uses of the mask. In particular, whether or not the mask satisfies certain specified quality criteria can be decided on the basis of this overall result.

What is claimed is:

1. A system for inspecting a mask for EUV lithography, comprising 1.1. a first partial system for optical inspection of a mask for identifying and/or localizing potential mask defects, wherein the first partial system comprises a first optical system for generating at least one first image of at least a portion of the mask, wherein the first optical system comprises an illumination device for generating radiation for illuminating the at least a portion of the mask, a projection device for projecting radiation from the at least a portion of the mask, and an imaging device for capturing the at least one first image of the at least a portion of the mask, wherein the first partial system is configured to identify and/or localize the potential mask defects based on the at least one first image of the mask generated by the first optical system, 1.2. a second partial system for pre-classification of the potential mask defects, wherein the second partial system comprises a second optical system for generating at least one second image of at least a portion of the mask, wherein the second optical system comprises an illumination device for generating radiation for illuminating the at least a portion of the mask, a projection device for projecting radiation from the at least a portion of the mask, and an imaging device for capturing the at least one second image of the at least a portion of the mask, wherein the second partial system is configured to pre-classify the potential mask defects based at least in part on the at least one second image of the mask generated by the second optical system, and 1.3. a third partial system for checking the potential mask defects, 1.4. wherein the second partial system is embodied in such a way that it assigns to the potential mask defects identified and/or localized by the first partial system a confidence parameter for characterizing the reliability of the identification and/or for characterizing the relevance of the defect to subsequent applications, and 1.5. wherein the third partial system is controllable in such a way that a subset of the mask defects identified and/or localized by the first partial system is checked on the basis of the confidence parameter assigned to the potential mask defects by the second partial system;
  wherein the second partial system has a classification speed $v_2$ and the third partial system has a checking speed $v_3$, wherein the following applies: $v_2 > v_3$.

2. The system of claim 1, wherein the second partial system for pre-classification of the potential mask defects utilizes an automated image analysis method.

3. The system of claim 1, wherein the second partial system for pre-classification of the potential mask defects utilizes machine learning.

4. The system of claim 1, wherein the second partial system has a memory for storing a database with pre-classified mask defects.

5. The system of claim 1, wherein the second partial system is embodied in such a way that it divides the potential mask defects into two, three or more classes.

6. The system of claim 1, wherein the first partial system for inspection of the mask utilizes illumination radiation at a wavelength of longer than 30 nm.

7. The system of claim 1, wherein the second partial system for pre-classification of the potential mask defects and/or the third partial system for checking a subset of the potential mask defects comprises an optical system with illumination radiation at a wavelength in the EUV range.

8. A method for inspecting a mask for EUV lithography, comprising the following steps:

8.1. providing a mask for EUV lithography, 8.2. a first inspection step for recording a first image of the provided mask and for identifying and/or localizing potential mask defects in the provided mask, including using a first optical system to generate the first image, wherein the first optical system comprises an illumination device for generating radiation for illuminating the provided mask, a projection device for projecting radiation from the provided mask, and an imaging device for recording the first image of the provided mask, wherein the identifying and/or localizing potential mask defects comprises identifying and/or localizing potential mask defects based on the first image, 8.3. a second inspection step for pre-classifying the potential mask defects into at least two nonempty subsets, including using a second optical system to generate a second image of the provided mask, wherein the second optical system comprises an illumination device for generating radiation for illuminating the provided mask, a projection device for projecting radiation from the provided mask, and an imaging device for recording the second image of the provided mask, wherein the pre-classifying the potential mask defects comprises pre-classifying the potential mask defects based on the second image, and 8.4. a third inspection step for checking the potential mask defects in one of the subsets ascertained in the second inspection step, 8.5. wherein the second inspection step for pre-classifying the potential mask defects comprises a method based on machine learning,
  wherein the second inspection step has a classification speed $v_2$ and the third inspection step has a checking speed $v_3$, wherein the following applies: $v_2 > v_3$.

9. The method of claim 8, wherein a distribution of one-dimensional and/or two-dimensional structures in the image of the mask recorded in the first inspection step is analyzed for the purposes of pre-classifying the potential mask defects.

10. The method of claim 8, wherein an intensity distribution in an image of the mask recorded in the first inspection step is analyzed for the purposes of pre-classifying the potential mask defects.

11. The method of claim 8, wherein the second inspection step comprises a comparison step for comparing the recorded image of the mask with data in a database.

12. The method of claim 8, wherein the third inspection step comprises an actinic method.

13. The method of claim 8, wherein the first inspection step comprises a non-actinic method.

14. The system of claim 2, wherein the second partial system for pre-classification of the potential mask defects utilizes machine learning.

15. The system of claim 2, wherein the second partial system has a memory for storing a database with pre-classified mask defects.

16. The system of claim 2, wherein the second partial system is embodied in such a way that it divides the potential mask defects into two, three or more classes.

17. The method of claim 9, wherein an intensity distribution in an image of the mask recorded in the first inspection step is analyzed for the purposes of pre-classifying the potential mask defects.

18. The method of claim 9, wherein the second inspection step comprises a comparison step for comparing the recorded image of the mask with data in a database.

19. The system of claim 1, wherein the second partial system comprises a second optical system for generating at least one second image of at least a portion of the mask, wherein the second partial system is configured to pre-classify the potential mask defects based at least in part on the at least one second image of the mask generated by the second optical system.

20. The system of claim 19, wherein the third partial system comprises a third optical system for generating at least one third image of at least a portion of the mask, wherein the third partial system is configured to check the potential mask defects based at least in part on the at least one third image of the mask generated by the third optical system.

21. The system of claim 20, wherein the third optical system is the same as the second optical system.

22. The system of claim 21, wherein the first optical system comprises a deep ultraviolet (DUV) optical system that uses deep ultraviolet light to illuminate the mask, and the second optical system comprises an extreme ultraviolet (EUV) optical system that uses extreme ultraviolet light to illuminate the mask.

23. The system of claim 19, wherein the first optical system comprises a deep ultraviolet (DUV) optical system that uses deep ultraviolet light to illuminate the mask, and the second optical system comprises an extreme ultraviolet (EUV) optical system that uses extreme ultraviolet light to illuminate the mask.

* * * * *